United States Patent [19]

Beeman

[11] 4,272,721
[45] Jun. 9, 1981

[54] ANALOG-TO-DIGITAL CONVERTER ALIGNMENT CIRCUIT

[75] Inventor: Robert H. Beeman, Berkeley, Ill.

[73] Assignee: GTE Automatic Electric Laboratories Inc., Northlake, Ill.

[21] Appl. No.: 967,340

[22] Filed: Dec. 7, 1978

[51] Int. Cl.³ .............................................. H03K 13/32
[52] U.S. Cl. .................................................. 324/73 R
[58] Field of Search ................ 324/77 AT, 130, 131, 324/73 R, 51; 340/347 CC

[56] References Cited

U.S. PATENT DOCUMENTS

| 3,562,743 | 2/1971 | Lerouge et al. | 340/347 DA |
| 3,579,103 | 5/1971 | Russell | 324/73 R |
| 3,597,761 | 8/1971 | Fraschilla et al. | 340/347 AD |
| 3,603,772 | 9/1971 | Paine et al. | 324/73 AT X |
| 3,816,813 | 6/1974 | Jehu | 324/73 R |

OTHER PUBLICATIONS

The Engineering Staff of Analog Devices, Inc., Analog–Digital Conversion Handbook, 6/1972, pp. 1–91.

Primary Examiner—Thomas J. Sloyan
Attorney, Agent, or Firm—Robert J. Black; Gregory G. Hendricks

[57] ABSTRACT

A circuit for monitoring the alignment of analog-to-digital converters. The digital output signal from a converter under test is separated into positive and negative component signals which are compared by a subtraction circuit. A difference signal is then generated by the subtraction circuit to represent the required converter adjustment. Also included are adder circuitry for a sum output and provisions for analog display.

8 Claims, 3 Drawing Figures

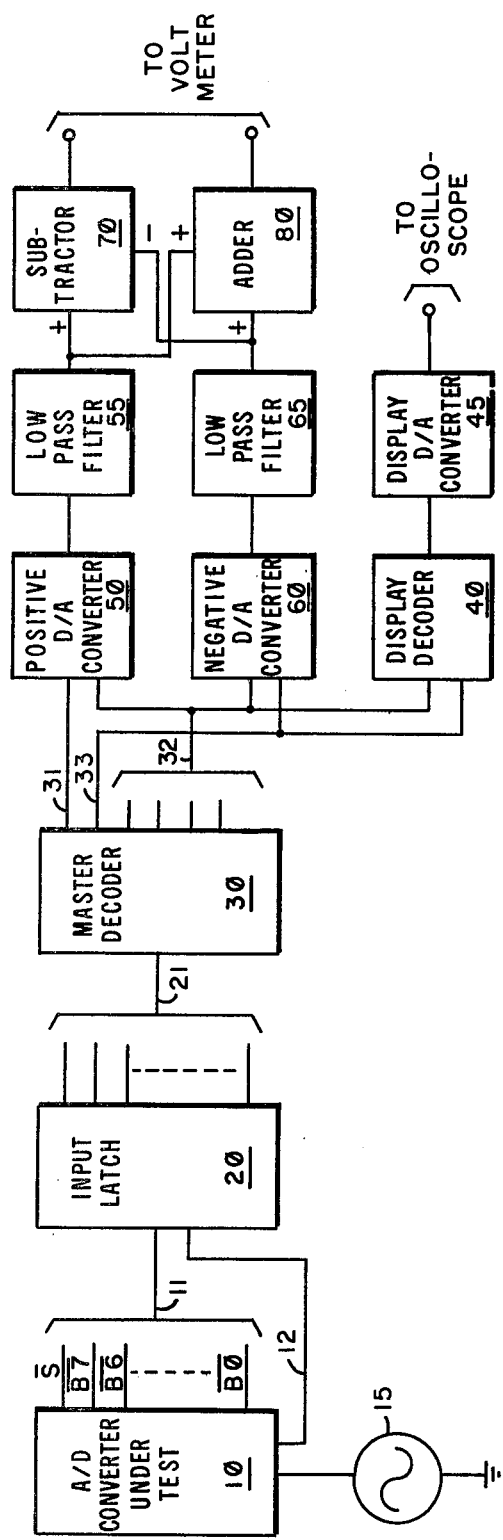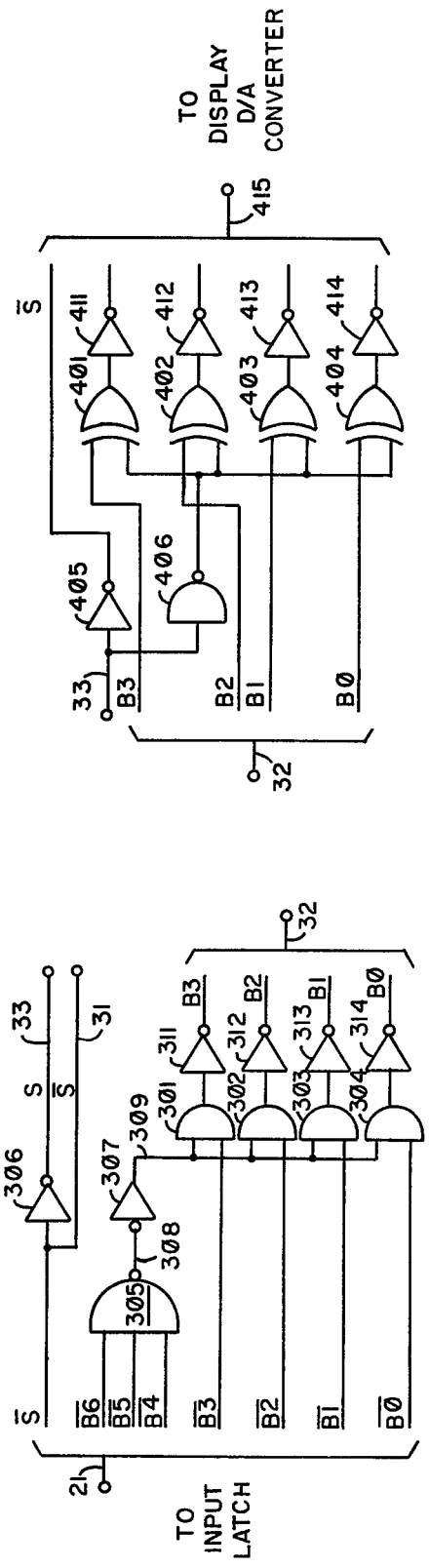

ANALOG-TO-DIGITAL CONVERTER ALIGNMENT CIRCUIT

BACKGROUND OF THE INVENTION

1. Field of the Invention

The present invention relates to test equipment for analog-to-digital converters and more particularly to a circuit for simplifying the adjustments required to eliminate offset errors in analog-to-digital converters.

2. Description of the Prior Art

An analog-to-digital converter encodes positive signals directly but negative samples are first inverted in a unity gain inverting amplifier and then encoded. This requires separate input and inverter offset adjustments. Offset in the input amplifier affects positive and negative samples equally and results in a DC component in the encoded output signal. Offset in the inverting amplifier causes an amplitude mis-alignment between the positive and negative halves of the signal and results in nonlinear distortion. In order for the converter to generate true digital representations of the analog input signal, these offset errors must be adjusted to zero.

The typical approach to this adjustment problem is to convert the digital output signals from the converter into an equivalent analog signal and display it on an oscilloscope. The operator must then make a visual determination of which way to adjust the two offset error adjustment controls. However, it is very difficult to determine visually when proper adjustment has been achieved because digitized sine waves are not "clear" in appearance and noise causes the converter output to jump randomly between adjacent steps, causing more than one level to be visible on the oscilloscope for each sample of the sinusoid. Also, because the input and inverting offset are analog quantities, they typically have values which are not integral multiples of the step size which causes further distortion of the oscilloscope waveform.

Accordingly it is an object of the present invention to provide a novel technique of adjusting analog-to-digital converters by reference to a distortion free voltmeter indication of offset errors.

SUMMARY OF THE INVENTION

The present invention is a circuit which allows offset error adjustments to be made to analog-to-digital converters by observing a voltmeter reading rather than a distorted unstable oscilloscope trace.

The circuit consists of an input latch circuit connected to an analog-to-digital converter under test which is connected to an input signal source. The input latch is also connected to a master decoder which is connected to a display decoder, a positive digital-to-analog converter and a negative digital-to-analog converter. The display decoder is also connected to a display digital-to-analog converter which can be connected to an oscilloscope. The positive digital-to-analog converter is also connected to a low pass filter and the negative digital-to-analog converter is connected to a second low pass filter. Each low pass filter is also connected to a subtractor circuit and an adder circuit both of which can be connected to a voltmeter.

The analog-to-digital converter under test periodically generates 8 bits of digital data representative of the instantaneous amplitude of an analog signal generated by the input signal source. The converter also generates a strobe signal when the digital data, including a sign bit, is available. The input latch circuit reponds to the strobe signal by storing the data available during the strobe signal, until the next strobe signal is generated, at which time new data is stored by the input latch circuit.

The master decoder includes gating circuitry which converts the stored data signals into sign plus magnitude format with four bits being used to represent the low level steps. The master decoder forces the output bits to the maximum positive value for steps above the highest positive step to be utilized and to the maximum negative value for steps more negative than the most negative step to be utilized.

The display decoder includes "exclusive-or" logic which converts this sign plus magnitude code into a one's complement code with an inverted sign bit. This code is then converted into equivalent analog signals by the display digital-to-analog converter.

The positive digital-to-analog converter generates an analog signal representative of the data bits when the sign bit is positive and the negative digital-to-analog converter generates an analog signal representative of the data bits when the sign bit is negative.

The low pass filters respond to these analog signals by generating a voltage equal to the average value of these analog signals.

The subtractor circuit generates a voltage representative of the difference between these two average signals and the adder circuit generates a voltage representative of their sum.

DESCRIPTION OF THE DRAWINGS

FIG. 1 is a block diagram of an analog-to-digital converter circuit in accordance with the present invention.

FIG. 2 is a logic diagram of the master decoder of FIG. 1.

FIG. 3 is a logic diagram of the display decoder of FIG. 1.

DESCRIPTION OF THE PREFERRED EMBODIMENT

Referring now to FIG. 1, the analog-to-digital converter alignment circuit of the present invention is shown connected to an analog-to-digital converter under test 10 which is connected to an input signal source 15.

The alignment circuit includes an input latch circuit 20 connected to the analog-to-digital converter under test 10 and to a master decoder 30 which is connected to a display decoder 40, to a positive digital-to-analog converter 50 and to a negative digital-to-analog converter 60. Display decoder 40 is also connected to a display digital-to-analog converter 45 which is connected to an oscilloscope. Positive digital-to-analog converter 50 is also connected to low pass filter 55 which is connected to subtractor 70 and adder 80. Negative digital-to-analog converter 60 is also connected to low pass filter 65 which is also connected to subtractor 70 and adder 80, both of which are connected to voltmeters.

In order to test and align an analog-to-digital converter it is first connected between input signal source 15 and the analog-to-digital converter alignment circuit. The converter under test 10 responds to analog signals from signal source 15 by generating digital data on leads 11 representative of an instantaneous amplitude of the analog input signal. Converter 10 also generates a strobe signal on lead 12 when the digital data is applied to leads 11. This digital data consists of 8 bits of data including a sign bit which are coded in inverted sign plus magnitude code.

Input latch 20 operates in response to the strobe signal to "capture" and store the digital data signals on leads 11. Input latch 20 stores this data until a new strobe signal is generated at which time input latch 20 "captures" and stores the new digital data signals.

Master decoder 30 operates in response to these stored digital data signals by inverting the sign and magnitude bits and then applying the sign bit to lead 33, and the inverted sign bit to lead 31. Master decoder 30 also decodes the three high order data bits and if one or more of them is at logic level 1, it forces the four low order bits to a logic level 1. If none of these bits are at logic level 1 master decoder 30 gates the low order data bits B0, B1, B2 and B3 to data leads 32. Thus, the master decoder 30 forces the output bits to the maximum positive value for magnitudes above the highest value to be used and it forces the output bits to the maximum negative value for magnitudes more negative than the most negative value to be used. This is done because only the low order bits are required to indicate offset errors.

The detailed logic diagram of the master decoder is shown in FIG. 2. This circuit includes and gates 301, 302, 303 and 304, nand gate 305 and inverter 306 connected to leads 21. Nand gate 305 is also connected to inverter 307 which is connected to gates 301, 302, 303 and 304. These gates are further connected to inverters 311, 312, 313 and 314 respectively and their outputs are connected to leads 32. Also, the output of inverter 306 is connected to lead 31 and its input is connected to lead 33.

Nand gate 305 performs an "OR" function by generating a logic level 1 on lead 308 in response to either $\overline{B4}$, $\overline{B5}$ or $\overline{B6}$ being at a logic level 0. Inverter 307 operates in response to a logic level 1 on lead 308 to generate a logic level 0 on lead 309. This causes gates 301, 302, 303 and 304 to generate logic level 0's and consequently inverters 311, 312, 313 and 314 generate logic level 1s on leads 32.

Therefore the master decoder shown in FIG. 2 forces signals B0, B1, B2 and B3 to all 1s to represent the maximum value for these signals whenever B4, B5 or B6 is true. If none of these bits is at a logic level 1, inverter 307 generates a logic level 1 on lead 309 causing gates 301, 302, 303 and 304 to gate the logic level of bits B0, B1, B2 and B3 to leads 32 after inversion by inverters 311, 312, 313 and 314. Inverter 306 operates to generate a positive sign bit on lead 33.

Referring again to FIG. 1 a display decoder 40 responds to the sign bit and low order data bits generated by master decoder 30 by converting the sign plug magnitude data format into a one's complement code with inverted sign bit as per the data shown in the following table.

TABLE 1

| Master Decoder Output Bits | | | Display Decoder Output Bits | | |
|---|---|---|---|---|---|
| S | B1 | B2 | B0 | B1 | B2 |
| 0 | 1 | 1 | 1 | 1 | 1 |
| 0 | 1 | 0 | 1 | 1 | 0 |
| 0 | 0 | 1 | 1 | 0 | 1 |
| 0 | 0 | 0 | 1 | 0 | 0 |
| 1 | 0 | 0 | 0 | 1 | 1 |
| 1 | 0 | 1 | 0 | 1 | 0 |
| 1 | 1 | 0 | 0 | 0 | 1 |

TABLE 1-continued

| Master Decoder Output Bits | | | Display Decoder Output Bits | | |
|---|---|---|---|---|---|
| 1 | 1 | 1 | 0 | 0 | 0 |

The detailed logic diagram of display decoder 45 is shown in FIG. 3. This circuit includes exclusive-or gates 401, 402, 403 and 404 connected to data leads 32 inverter 405 connected to lead 33, and nand gate 406 also connected to lead 33. Nand gate 406 is also connected to exclusive-or gates 401, 402, 403 and 404 which are connected to inverters 411, 412, 413 and 414 respectively. The output leads of these inverters 415 are then connected to a display digital-to-analog converter 45. Referring to the second entry of Table 1, for example, it can be seen that the sign bit must be converted from a logic level 0 to a logic level 1. As can be seen from FIG. 3, inverter 405 will do this. FIG. 3 also shows that each bit is exclusive-or'd with the sign bit as required in Table 1.

Referring again to FIG. 1, display digital-to-analog converter 45 is shown connected to display decoder 40. Display converter 45 operates in response to the one's complement data bits and the inverted sign bit generated by display decoder 40 to generate an analog representation of the value of those data bits. Since display converter 45 is connected to an oscilloscope, this analog signal is displayed by said oscilloscope to give a visual indication of the output signals 11 from the analog-to-digital converter 10.

Positive digital-to-analog converter 50 operates in response to a logic level 0 sign bit to connect the low order data bits B0, B1, B2 and B3 into a first analog representation of the value of those data bits.

Negative digital-to-analog converter 60 operates similarly except it responds to a logic level 1 sign bit to convert the low order data bits B0, B1, B2 and B3 into a second analog representation of the value of those data bits. Thus the positive digital-to-analog converter generates the first analog signal in response to positive half cycles of the input signals and it generates a zero otherwise. Similarly the negative digital-to-analog converter generates the second analog signal in response to negative half cycles of the input signals and it also generates a zero otherwise.

Low pass filters 55 and 65 respond to the first and second analog signals respectively by filtering those signals such that they generate first and second DC output signals representative of the average value of said first and said second analog signals.

Subtractor 70 operates in response to said first and second DC output signals to generate a signal representative of the difference between these two signals. This difference signal is then indicated as a voltage level on a voltmeter. Similarly adder 80 operates in response to said first and second DC output signals to generate a signal representative of the sum of these two signals. This sum signal is also indicated as a voltage level on a voltmeter. Subtractor 70 and adder 80 comprise well known operational amplifiers. Similarly the digital-to-analog converters 45, 50 and 60 are implemented following well known techniques, as are low pass filters 55 and 65.

Alternatively this invention could be made using digital techniques with digital filters replacing the low pass filters and arithmetic logic units or digital adders and subtractors replacing the analog adders and subtractors. The output signals could be either digital displays or they could be connected to an analog signal to drive a meter.

Since this invention uses long term average rather than instantaneous waveform behavior the method of adjustment of the input offset and inverting offset of the analog-to-digital converter under test is faster and more accurate because the operator need only adjust the converter to a zero voltmeter reading rather than a fuzzy and jittery oscilloscope trace. However, this invention still provides an oscilloscope trace and a voltmeter indication of the sum of the two cycles for reference.

It will be obvious to those skilled in the art that numerous modifications of the present invention can be made without departing from the spirit of the invention which shall be limited only by the scope of the claims appended hereto.

What is claimed is:

1. A monitor circuit for use in a system for test and alignment of an analog-to-digital converter, said system including a voltage measuring device, a source of analog signals, an analog-to-digital converter under test connected to said analog signal source, operated in response to said analog singals to generate a strobe signal and digital data representative of said analog signals, said monitor circuit comprising:
    storage means connected to said converter operated in response to said strobe signal to store said digital data;
    decoding means connected to said storage means operated in response to said stored data signals to generate sign and magnitude signals;
    first signal conversion means connected to said decoding means operated in response to said magnitude signals and a first sign signal to generate a first filtered signal below a frequency of a predetermined value;
    second signal conversion means connected to said decoding means operated in response to said magnitude signals and a second sign signal to generate a second filtered signal below said predetermined frequency;
    subtraction means connected to said voltage measuring device, and to said first and to said second signal conversion means operated in response to said first and to said second filtered signals to generate a signal representative of the difference between said first and said second filtered signal;
    said stored data signals are coded in inverted sign plus magnitude code and said decoding means converts said inverted sign plus magnitude stored data signals to sign plus magnitude signals for values of stored data signals below a predetermined threshold and operated to convert stored data signals above said predetermined threshold to a sign signal plus a predetermined magnitude signal.

2. A monitor circuit as claimed in claim 1, wherein there is further included: addition means connected to said voltage measuring device, to said first and to said second signal conversion means operated in response to said first and to said second filtered signals to generate a signal representative of the sum of said first and said second filtered signal.

3. A monitor circuit for use in a system for test and alignment of an analog-to-digital converter, said system including a voltage measuring device, an oscilloscope, a source of analog signals, analog-to-digital converter under test connected to said analog signal source, operated in response to said analog signals to generate a strobe signal and digital data representative of said analog signals, said monitor circuit comprising:
    storage means connected to said converter operated in response to said strobe signal to store said digital data;
    decoding means connected to said storage means operated in response to said stored data signals to generate sign and magnitude signals;
    first signal conversion means connected to said decoding means operated in response to said magnitude signals and a first sign signal to generate a first filtered signal below a frequency of a predetermined value;
    second signal conversion means connected to said decoding means operated in response to said magnitude signals and a second sign signal to generate a second filtered signal below said predetermined frequency;
    subtraction means connected to said voltage measuring device, and to said first and to said second signal conversion means operated in response to said first and to said second filtered signals to generate a signal representative of the difference between said first and said second filtered signal;
    display means connected to said oscilloscope and to said decoding means operated in response to said sign and magnitude signals to generate an analog signal representative of said sign and said magnitude signals;
    said display means comprise a display decoder connected to said decoding means and a digital-to-analog converter connected to said display decoder, said display decoder operated in response to said sign plus magnitude signals to generate a one's complement code whose smallest value represents the maximum negative sign plus magnitude signal and whose largest value represents the maximum positive sign plus magnitude signal.

4. A monitor circuit as claimed in claim 1, wherein: said first signal conversion means comprise a positive digital-to-analog converter connected to said decoding means and a low pass filter connected to said converter, said converter operated in response to a positive value of said sign signal to convert said magnitude signals to an analog signal representative of said magnitude signals.

5. A monitor circuit as claimed in claim 1, wherein: said second signal conversion means comprise a negative digital-to-analog converter connected to said decoding means and a low pass filter connected to said converter, said converter operated in response to a negative value of said sign signal to convert said magnitude signals to an analog signal representative of said magnitude signals.

6. A monitor circuit as claimed in claim 1, wherein: said storage means comprise an N-bit latch circuit.

7. A monitor circuit as claimed in claim 2, wherein: said addition and said subtraction means each comprise an operational amplifier.

8. A monitor circuit as claimed in claim 2, wherein: said first and said second signal conversion means each comprise a digital filter and said addition and said subtraction means comprise a digital adder and a digital subtractor.

* * * * *